(12) United States Patent
Rouh et al.

(10) Patent No.: US 7,790,551 B2
(45) Date of Patent: Sep. 7, 2010

(54) METHOD FOR FABRICATING A TRANSISTOR HAVING A RECESS GATE STRUCTURE

(75) Inventors: Kyoung Bong Rouh, Goyang-si (KR); Seung Woo Jin, Icheon-si (KR); Min Yong Lee, Seoul (KR); Yong Soo Jung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/603,906

(22) Filed: Oct. 22, 2009

(65) Prior Publication Data

US 2010/0041196 A1 Feb. 18, 2010

Related U.S. Application Data

(62) Division of application No. 11/450,118, filed on Jun. 9, 2006, now abandoned.

(30) Foreign Application Priority Data

Nov. 25, 2005 (KR) .............................. 2005-113730

(51) Int. Cl.
 *H01L 21/336* (2006.01)
(52) U.S. Cl. ................... 438/270; 438/156; 438/271; 438/272; 438/282; 257/E21.428; 257/E21.429
(58) Field of Classification Search ............... 438/156, 438/270–272, 282; 257/E21.428–E21.429
See application file for complete search history.

(56) References Cited

U.S. PATENT DOCUMENTS

| 4,243,997 | A | 1/1981 | Natori et al. |
| 5,270,228 | A | 12/1993 | Ishikawa |
| 5,362,677 | A | 11/1994 | Sakamoto et al. |
| 6,933,556 | B2 | 8/2005 | Endoh et al. |
| 2003/0227050 | A1 | 12/2003 | Yoshimochi |
| 2006/0097314 | A1* | 5/2006 | Uchiyama ................... 257/330 |
| 2007/0045753 | A1* | 3/2007 | Pae et al. .................... 257/410 |

FOREIGN PATENT DOCUMENTS

| JP | 2003324197 | 11/2003 |
| KR | 1020040058796 | 5/2004 |

* cited by examiner

*Primary Examiner*—Kiesha R Bryant
*Assistant Examiner*—Minchul Yang
(74) *Attorney, Agent, or Firm*—Marshall, Gerstein & Borun LLP

(57) ABSTRACT

A transistor having a recess gate structure and a method for fabricating the same. The transistor includes a gate insulating layer formed on the inner walls of first trenches formed in a semiconductor substrate; a gate conductive layer formed on the gate insulating layer for partially filling the first trenches; gate electrodes formed on the gate conductive layer for completely filling the first trenches, and surrounded by the gate conductive layer; channel regions formed in the semiconductor substrate along the first trenches; and source/drain regions formed in a shallow portion of the semiconductor substrate.

5 Claims, 3 Drawing Sheets

METHOD FOR FABRICATING A TRANSISTOR HAVING A RECESS GATE STRUCTURE

CROSS-REFERENCE TO RELATED APPLICATIONS

This is a division of U.S. application Ser. No. 11/450,118 filed Jun. 9, 2006, which claims the priority benefit under USC 119 of KR 2005-113730 filed Nov. 25, 2005, the entire respective disclosures of which are incorporated herein by reference.

BACKGROUND OF THE INVENTION

1. Field of the Invention

The invention relates to a transistor and a method for fabricating the same, and more particularly to a transistor having a recess gate structure and a method for fabricating the same.

2. Description of the Related Art

As the degree of integration of semiconductor devices has rapidly increased, the width of gates of transistors forming the semiconductor device has gradually decreased. In order to facilitate this trend, the concentration of impurities at junction regions and channels has gradually increased and the intensity of the electric field between a source region and a drain region has gradually increased. Electrons accelerate between the source region and the drain region due to the increased intensity of the electric field, thus generating a large number of hot carriers attacking a gate insulating layer close to the drain region. The hot carriers deteriorate electrical characteristics of the semiconductor device. Particularly, in a semiconductor memory, such as a DRAM, a leakage current is generated due to the increase of the intensity of an electric field between a source region and a drain region, thus exerting a bad influence on the refresh characteristic, which is one of the more important characteristics of the DRAM.

In addition to the foregoing structural problems, methods for fabricating the semiconductor device have several problems, as follows. Since the distance between the source region and the drain region is reduced, a punch-through margin is gradually decreased, and thus, the method further requires ion implantation for stopping punch-through. Particularly, a method for fabricating the DRAM further requires planarization of a landing plug for improving the refresh characteristic. That is, additional steps, which do not directly relate to the operation of the semiconductor device, are required in the manufacturing process.

In order to suppress the generation of hot carriers, a method for forming source and drain regions having a lightly doped drain (LDD) structure is most widely used. When the semiconductor device employs the LDD structure, the intensity of an electrical field between the source region and the drain region is decreased, but the concentration of impurities at both ends of a channel region is relatively decreased and thereby the amount of current is simultaneously decreased, thus obstructing high-speed switching operation of the semiconductor device.

Accordingly, in order to assist the high-speed switching operation of the semiconductor device and prevent the degradation of the semiconductor device due to the hot carriers, the length of gates is increased. However, the increase of the length of the gates exerts a bad influence on the integration of the semiconductor device. Further, the increase of the length of channels reduces the saturation current of a drain.

SUMMARY OF THE INVENTION

The invention provides a transistor having a recess gate structure and a method for fabricating the same.

In accordance with one aspect, the invention provides a transistor having a recess gate structure comprising a gate insulating layer formed on the inner walls of first trenches formed in a semiconductor substrate; a gate conductive layer formed on the gate insulating layer for partially filling the first trenches; gate electrodes formed on the gate conductive layer for completely filling the first trenches, and surrounded by the gate conductive layer; channel regions formed in the semiconductor substrate along the first trenches; and source/drain regions formed in a shallow portion of the semiconductor substrate and separated from the upper portions of the first trenches by the channel regions.

In preferred forms, the gate insulating layer may be an oxide layer, the gate conductive layer may be a polysilicon layer, and the gate electrodes may be made of a metal layer.

The surfaces of the source/drain regions are preferably located at the same level as the surfaces of the gate conductive layer and the gate electrodes.

The transistor may further include a capping layer pattern formed on the gate conductive layer and the gate electrodes for selectively exposing the surfaces of the gate electrodes.

The capping layer pattern may include a nitride layer.

In accordance with another aspect, the invention provides a method for fabricating a transistor having a recess gate structure including the steps of forming first trenches having a designated depth in a semiconductor substrate; forming channel regions in the semiconductor substrate having the first trenches formed therein along the first trenches by ion implantation; forming a gate insulating layer on the semiconductor substrate having the channel regions formed therein; forming a gate conductive layer on the gate insulating layer, to form second trenches in the first trenches; forming gate electrodes filling the second trenches; partially removing the upper portions of the gate electrode, the gate conductive layer, and the semiconductor substrate by planarization; and implanting impurity ions into the semiconductor substrate exposed by the planarization, to form source/drain regions.

Preferably, the depth of the first trenches is less than 2,000 Å.

The method may further include the step of cleaning the semiconductor substrate using $CFO_2$ or $CF_4$ gas after the formation of the first trenches.

The method may further include the step of forming a liner oxide layer after the formation of the first trenches.

The method may further include the step of performing an annealing process after the formation of the first trenches.

BRIEF DESCRIPTION OF THE DRAWINGS

The features and advantages of the invention will be more clearly understood from the following detailed description taken in conjunction with the accompanying drawings, in which.

DESCRIPTION OF THE PREFERRED EMBODIMENTS

Preferred embodiments of the invention are described in detail below with reference to the drawings.

Figure 1:
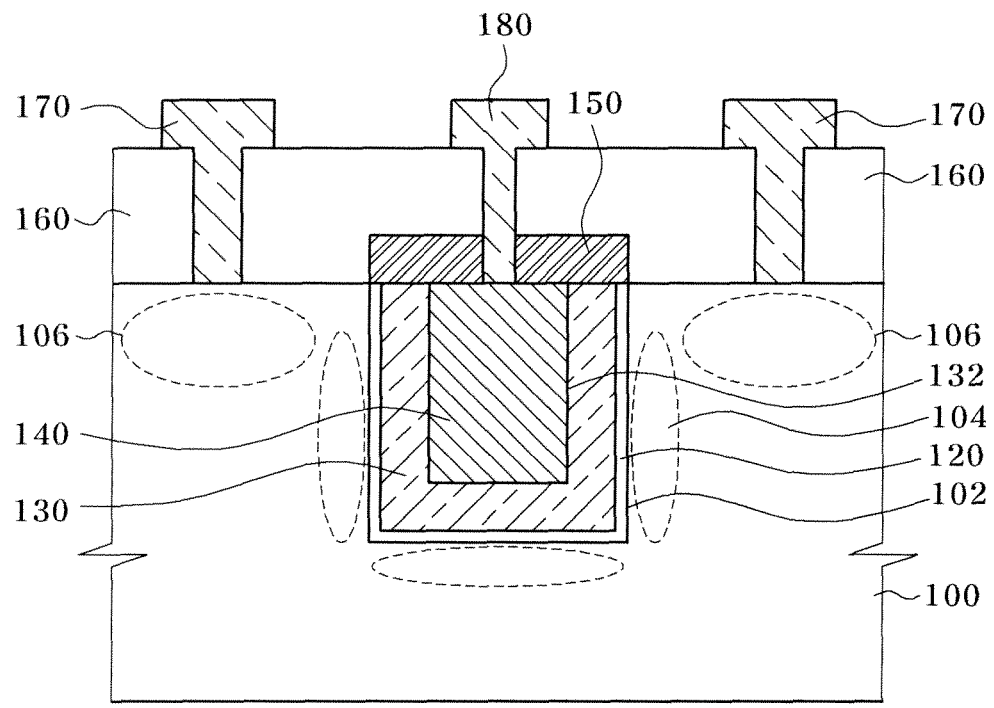
FIG. 1 is a sectional view of a transistor having a recess gate structure in accordance with the invention.

FIG. 1 is a sectional view of a transistor having a recess gate structure in accordance with the invention.

With reference to FIG. 1, a gate insulating layer 120 is disposed in first trenches 102 formed in a semiconductor substrate 100. The first trenches 102 have a depth of 2,000 Å or less. Although an oxide layer is illustratively used as the gate insulating layer 120, other insulating layers or a ferroelectric layer may be used as the gate insulating layer 120. Further, the gate insulating layer 120 has a multi-layered structure having at least two layers. A polysilicon layer 130 serving as a gate conductive layer is formed on the gate insulating layer 120. The polysilicon layer 130 has a thickness so as not to completely fill the first trench 102. Thus, second trenches 132 having a width smaller than that of the first trenches 102 are formed by the polysilicon layer 130. Gate electrodes 140 filling the second trenches 132 are formed on the polysilicon layer 130. The gate electrodes 140 are made of a metal layer or a metal silicide layer. The whole surfaces of the gate electrodes 140 are surrounded by the polysilicon layer 130.

Channel regions 104 are disposed in the semiconductor substrate 100 along the first trenches 102, and source/drain regions 106 are disposed at both sides of the first trenches 102 in a shallow portion of the semiconductor substrate 100. The surfaces of the source/drain regions 106 are located at the same level as the surfaces of the polysilicon layer 130 and the gate electrodes 140. The source/drain regions 106 are separated from the upper portions of the first trenches 102 by the channel regions 104. A capping layer pattern 150 is disposed on the upper surfaces of the gate insulating layer 120, the polysilicon layer 130 and the gate electrodes 140. The capping layer pattern 150 serves to prevent breakdown or current leakage at recess gates, and is made of a nitride layer. The capping layer pattern 150 has openings, each of which exposes a part of the surface of each of the gate electrodes 140, in which a contact is formed. An insulating layer 160 is disposed on the semiconductor substrate 100. A source/drain metal layer 170 is connected to the source/drain regions 106 via holes formed through the insulating layer 160, and a gate metal layer 180 is connected to the gate electrodes 140 via other holes formed through the insulating layer 160 and the openings of the capping layer pattern 150.

Depending on the above structure, a transistor of the invention has recess gates disposed in the first trenches 102 of the semiconductor substrate 100. This recess gates do not require a gate spacer layer, which is necessary to insulate conventional planar gates from other parts. Further, since the source/drain regions 106 are located on the gates, it is possible to increase a short channel margin and assure a punch-through margin. Accordingly, the transistor having the recess gates does not require an LDD structure, and obtains high-concentration source/drain regions, thus ensuring a sufficient amount of current and performing a high-speed switching operation. Particularly, the surfaces of the source/drain regions 106 are located at the same level as the surfaces of the polysilicon layer 130 and the gate electrodes 140, thus preventing the generation of a difference of heights between the semiconductor substrate 100 and the gates when the insulating layer 160 is formed on the semiconductor substrate 100. Further, when the transistor having the above recess gates is applied to a semiconductor memory, such as a DRAM, it is possible to omit additional steps, such as planarization of a landing plug.

FIGS. 2 to 5 are sectional views illustrating a method for fabricating a transistor having a recess gate structure in accordance with the invention.

Figure 2:
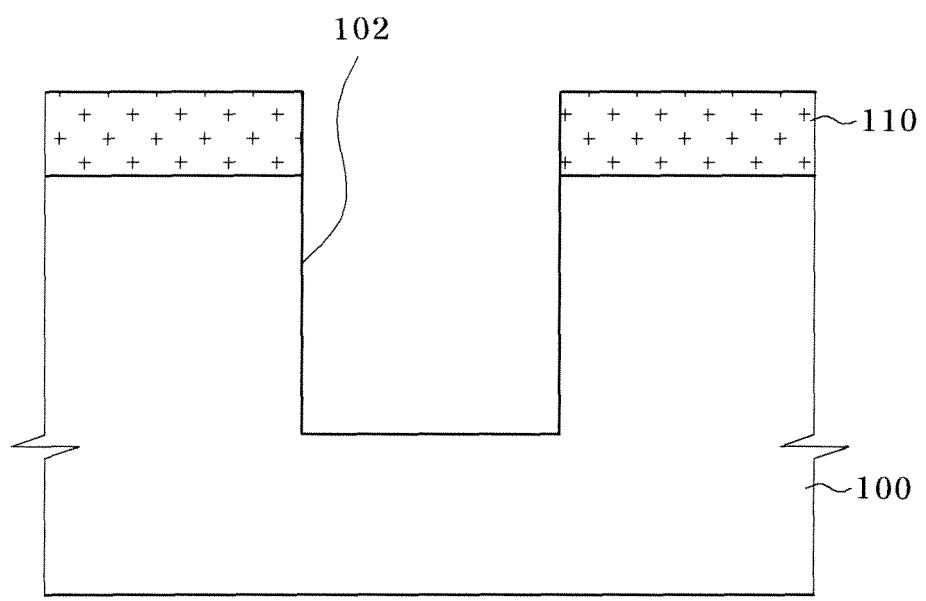
FIGS. 2 to 5 are sectional views illustrating a method for fabricating a transistor having a recess gate structure in accordance with the invention.

First, with reference to FIG. 2, a mask layer pattern 110 is formed on the semiconductor substrate 100, such as a silicon substrate. The mask layer pattern 110 is made of a photoresist layer. The mask layer pattern 110 has openings for exposing the surfaces of regions of the semiconductor substrate 100, i.e., regions on which recess gates will be formed. Thereafter, the exposed regions of the semiconductor substrate 100 are etched to a designated depth, for example, less than 2,000 Å, using the mask layer pattern 110 as an etching mask, thus forming the first trenches 102. After the first trenches 102 are formed, in order to recover damage to the surface of the semiconductor substrate 100 by etching, the surface of the semiconductor substrate 100 may be cleaned using $CFO_4$ gas or $CF_4$ gas. Further, a liner oxide layer may be formed on the inner walls of the first trenches 102, or annealing may be performed. After the first trenches 102 are formed, the mask layer pattern 110 is removed from the surface of the semiconductor substrate 100.

Figure 3:
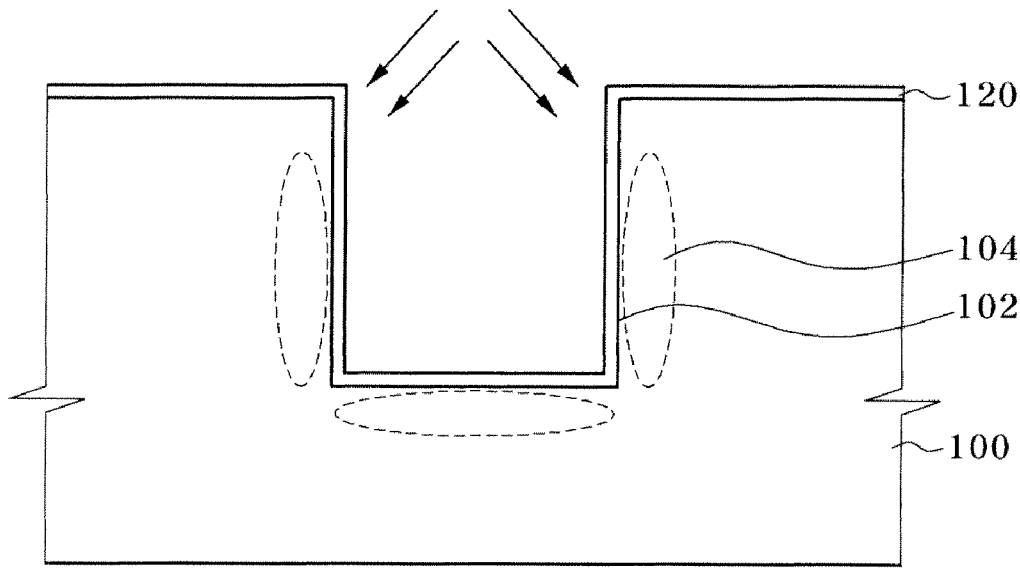

Thereafter, with reference to FIG. 3, the gate insulating layer 120 is formed on the whole surface of the semiconductor substrate 100 having the first trenches 102 formed therein. Although an oxide layer formed by thermal oxidation is illustratively used as the gate insulating layer 120, other insulating layers or a ferroelectric layer, if necessary, may be used as the gate insulating layer 120. Further, the gate insulating layer 120 has a multi-layered structure having at least two layers. Then, the channel regions 104 are formed along the circumferences of the first trenches 102 by channel ion implantation. During the channel ion implantation, ions are implanted into the first trenches 102 at a tilt, as shown by arrows of FIG. 3. Although not shown in drawings, ion implantation for adjusting a threshold voltage may be performed.

Figure 4:
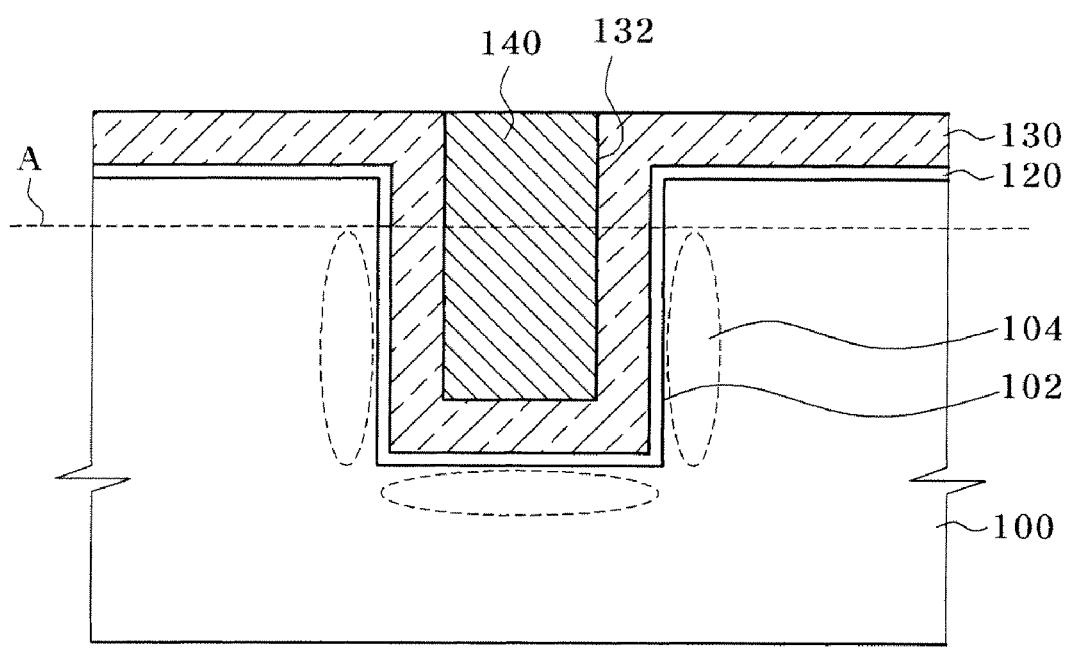

Then, with reference to FIG. 4, the polysilicon layer 130 serving as a gate conductive layer is formed on the gate insulating layer 120. The polysilicon layer 130 has a thickness so as not to completely fill the first trenches 102. Thus, the second trenches 132 having a width smaller than that of the first trenches 102 are formed by the polysilicon layer 130. Then, the gate electrodes 140 completely filling the second trenches 132 are formed on the polysilicon layer 130. The gate electrodes 140 are made of a metal layer or a metal silicide layer.

Figure 5:
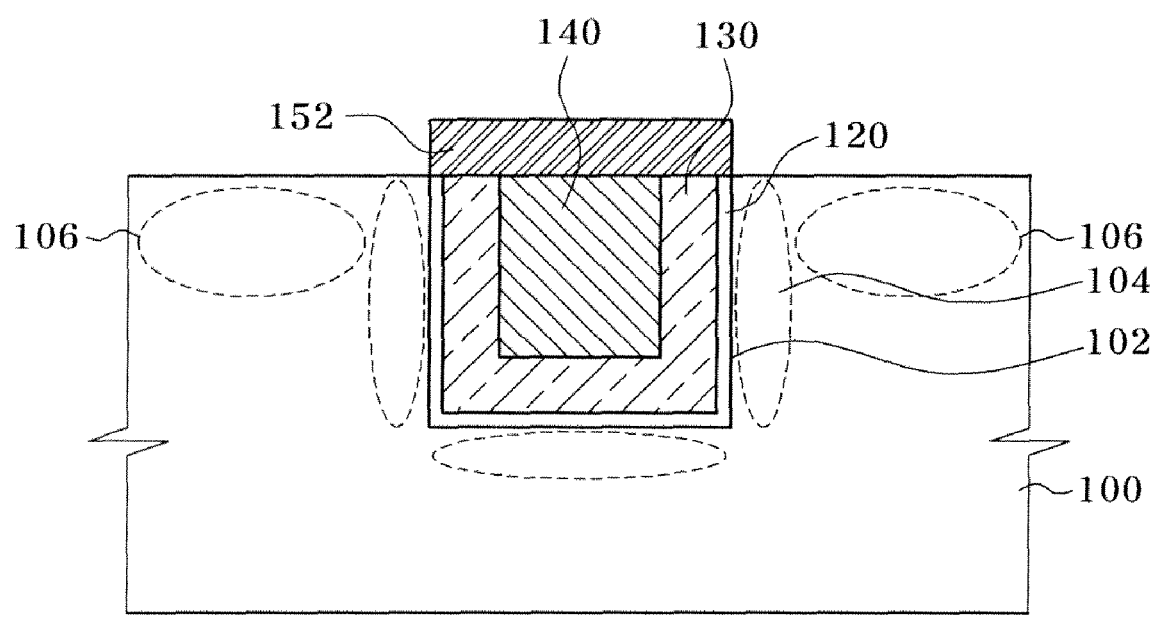

With reference to FIG. 5, planarization of the structure of FIG. 4 is performed. The planarization uses chemical mechanical polishing (CMP). As shown by a dotted line (A), the upper portion of the semiconductor substrate 100 having a designated thickness is eliminated by the planarization. Impurities are implanted into the semiconductor substrate 100, which is exposed to the outside by the planarization, using ion implantation, thus forming the source/drain regions 106. Then, a capping layer 152 is formed on the upper surfaces of the gate insulating layer 120, the polysilicon layer 130 and the gate electrodes 140. A nitride layer may be used as the capping layer 152.

Then, as shown in FIG. 1, the capping layer 152 is patterned, thus forming the capping layer pattern 150 for selectively exposing the surfaces of the gate electrodes 140, the insulating layer 160 is formed on the whole surface of the semiconductor substrate 100, and the source/drain metal layer 170 and the gate metal layer 180, which are respectively connected to the source/drain regions 106 and the gate electrodes 140 via the holes formed through the insulating layer 160, are formed.

On the other hand, another method, which differs from the above method as shown in FIGS. 2 to 5, may be used to fabricate a transistor having a recess gate structure of the invention. For example, gates are formed in a semiconductor substrate using a mask, an epitaxial layer is grown at both sides of the gates, and source/drain regions are formed in the epitaxial layer, thereby forming recess gates. In this case, the epitaxial layer may be formed at the source/drain regions by doping, or the epitaxial layer may be formed at one region of the source/drain regions by doping and ions may be implanted into the other region of the source/drain regions.

As apparent from the foregoing description, the invention provides a transistor having a recess gate structure and a method for fabricating the same. The transistor of the invention does not require a gate spacer layer, which is necessary to insulate conventional planar gates from other parts, and has source/drain regions located on the gates, thus increasing a short channel margin and assuring a punch through margin. Accordingly, the transistor of the invention does not require an LDD structure, and obtains high-concentration source/drain regions, thus ensuring a sufficient amount of current and performing a high-speed switching operation. Particularly, the surfaces of the source/drain regions are located at the same level as the surfaces of a polysilicon layer and gate electrodes, thus preventing the generation of a difference of heights between the semiconductor substrate and gates when the insulating layer is formed on the semiconductor substrate. Further, when the transistor of the invention is applied to a semiconductor memory, such as a DRAM, it is possible to omit additional steps, such as planarization of a landing plug.

Although the preferred embodiments of the invention have been disclosed for illustrative purposes, those skilled in the art will appreciate that various modifications, additions and substitutions are possible, without departing from the scope and spirit of the invention as recited in the accompanying claims.

What is claimed is:

1. A method for fabricating a transistor having a recess gate structure comprising:
    forming first trenches having a designated depth in a semiconductor substrate;
    forming channel regions in the semiconductor substrate having the first trenches formed therein along the first trenches by ion implantation;
    forming a gate insulating layer on the semiconductor substrate having the channel regions formed therein;
    forming a gate conductive layer on the gate insulating layer, to form second trenches in the first trenches;
    forming gate electrodes filling the second trenches;
    partially removing the upper portions of the gate electrode, the gate conductive layer, and the semiconductor substrate by planarization; and
    implanting impurity ions into the semiconductor substrate exposed by the planarization, to form source/drain regions.

2. The method of claim 1, wherein the depth of the first trenches 2,000 Å or less.

3. The method of claim 1, further comprising cleaning the semiconductor substrate using $CFO_2$ or $CF_4$ gas after forming the first trenches.

4. The method of claim 1, further comprising forming a liner oxide layer after forming the first trenches.

5. The method of claim 1, further comprising performing an annealing process after forming the first trenches.

* * * * *